(12) United States Patent
Lin et al.

(10) Patent No.: US 12,212,926 B2
(45) Date of Patent: Jan. 28, 2025

(54) MEMS STRUCTURE

(71) Applicant: Fortemedia, Inc., Santa Clara, CA (US)

(72) Inventors: Wen-Shan Lin, Tainan (TW);
Chun-Kai Mao, Tainan (TW);
Chih-Yuan Chen, Tainan (TW);
Jien-Ming Chen, Tainan (TW);
Feng-Chia Hsu, Tainan (TW); Nai-Hao Kuo, Tainan (TW)

(73) Assignee: FORTEMEDIA, INC., Alviso, CA (US)

( * ) Notice: Subject to any disclaimer, the term of this patent is extended or adjusted under 35 U.S.C. 154(b) by 214 days.

(21) Appl. No.: 18/050,606

(22) Filed: Oct. 28, 2022

(65) Prior Publication Data

US 2024/0015446 A1 Jan. 11, 2024

Related U.S. Application Data (60) Provisional application No. 63/367,730, filed on Jul. 6, 2022.

(51) Int. Cl.
*H04R 19/04* (2006.01)
*B81B 3/00* (2006.01)

(52) U.S. Cl.
CPC ............ *H04R 19/04* (2013.01); *B81B 3/007* (2013.01); *B81B 2201/0257* (2013.01); *B81B 2203/0127* (2013.01); *B81B 2203/019* (2013.01); *H04R 2201/003* (2013.01)

(58) Field of Classification Search
CPC .... H04R 19/04; H04R 2201/003; H04R 7/18; H04R 31/00; H04R 7/04; H04R 7/06; H04R 7/16; H04R 7/14; H04R 17/02; H04R 7/12; H04R 1/222; H04R 2307/025; H04R 7/02; H04R 7/20; H04R 2207/021; H04R 1/1058; H04R 2307/207; H04R 1/2807; H04R 2231/003; H04R 7/24; B81B 3/007; B81B 2201/0257; B81B 2203/0127; B81B 2203/019
USPC .................. 381/174, 175, 113, 398, 396, 423
See application file for complete search history.

(56) References Cited

U.S. PATENT DOCUMENTS

2019/0210866 A1* 7/2019 Chen ..................... B81B 3/0072
2021/0168497 A1* 6/2021 Wen ........................ H04R 31/00

FOREIGN PATENT DOCUMENTS

CN           212435931        * 1/2021

* cited by examiner

*Primary Examiner* — Norman Yu
(74) *Attorney, Agent, or Firm* — McClure, Qualey & Rodack, LLP (57) ABSTRACT

A MEMS structure is provided. The MEMS structure includes a substrate and a backplate, the substrate has an opening portion, and the backplate is disposed on one side of the substrate and has acoustic holes. The MEMS structure also includes a diaphragm disposed between the substrate and the backplate, and the diaphragm extends across the opening portion of the substrate and includes outer ventilation holes and inner ventilation holes arranged in a concentric manner. The outer ventilation holes and the inner ventilation holes are relatively arranged in a ring shape and surround the center of the diaphragm. The MEMS structure further includes a pillar disposed between the backplate and the diaphragm. The pillar prevents the diaphragm from being electrically connected to the backplate.

18 Claims, 10 Drawing Sheets

MEMS STRUCTURE

CROSS REFERENCE TO RELATED APPLICATIONS

This application claims the benefit of U.S. Provisional Application No. 63/367,730, filed on Jul. 6, 2022, the entirety of which is incorporated by reference herein.

BACKGROUND

Technical Field

Embodiments of the present disclosure relate in general to an acoustic transducer, and in particular they relate to a micro-electro-mechanical system (MEMS) structure that may be used in a micro-electro-mechanical system microphone.

Description of the Related Art

The current trend in personal electronics is toward fabricating slim, compact, lightweight and high-performance electronic devices, including microphones. A microphone is used to receive sound waves and convert acoustic signals into electrical signals. Microphones are widely used in daily life and are installed in such electronic products as telephones, mobiles phones, and recording pens. In a capacitive microphone, variations in acoustic pressure (i.e., local pressure deviation from the ambient atmospheric pressure caused by sound waves) force the diaphragm to deform correspondingly, and the deformation of the diaphragm induces a capacitance variation. The variation of acoustic pressure of the sound waves can thus be obtained by detecting the voltage difference caused by the capacitance variation.

This is distinct from conventional electret condenser microphones (ECM), in which mechanical and electronic elements of micro-electro-mechanical system (MEMS) microphones can be integrated on a semiconductor material using integrated circuit (IC) technology to fabricate a miniature microphone. MEMS microphones have such advantages as a compact size, being lightweight, and having low power consumption, and they have therefore entered the mainstream of miniaturized microphones. In addition to the basic sensitivity, total harmonic distortion (THD), signal-to-noise ratio (SNR), and acoustic overload point (AOP) are key indicators for high-end microphones.

Although existing MEMS microphones have generally been adequate for their intended purposes, they have not been entirely satisfactory in all respects. For example, when the diaphragm is affected by sound pressure that causes the displacement change, the capacitance between the backplate and the diaphragm may be changed. However, when the diaphragm is deformed by the sound pressure, the diaphragm may produce a sharper peak in the existing MEMS microphone. Furthermore, the induced charge tends to accumulate at the tip when the diaphragm is deformed, which leads to the nonlinearity of the induction.

SUMMARY

The micro-electro-mechanical system (MEMS) structure in the present disclosure may be used in a micro-electro-mechanical system microphone, which includes outer or inner ventilation holes of the diaphragm or a rib structure disposed on one side of the diaphragm. In some embodiments, due to the outer or inner ventilation holes of the diaphragm and the rib structure, part of the diaphragm can be strengthened, so that a relatively flat deformation plateau zone of the diaphragm may be formed after the diaphragm is deformed by the sound pressure. Therefore, the distribution of the induced charge is more uniform and the capacitance between the backplate and the diaphragm is improved, thereby improving the total harmonic distortion (THD), signal-to-noise ratio (SNR), and acoustic overload point (AOP) of the MEMS microphones.

Some embodiments of the present disclosure include a MEMS structure. The MEMS structure includes a substrate and a backplate, the substrate has an opening portion, and the backplate is disposed on one side of the substrate and has acoustic holes. The MEMS structure also includes a diaphragm disposed between the substrate and the backplate, and the diaphragm extends across the opening portion of the substrate and includes outer ventilation holes and inner ventilation holes arranged in a concentric manner. The outer ventilation holes and the inner ventilation holes are relatively arranged in a ring shape and surround the center of the diaphragm. The MEMS structure further includes a pillar disposed between the backplate and the diaphragm. The pillar prevents the diaphragm from being electrically connected to the backplate.

In some embodiments, the outer ventilation holes are divided into first outer ventilation holes and second outer ventilation holes, and the first outer ventilation holes and the second outer ventilation holes are staggered relative to the center of the diaphragm.

In some embodiments, the inner ventilation holes are divided into first inner ventilation holes and second inner ventilation holes, and the first inner ventilation holes and the second inner ventilation holes are staggered relative to the center of the diaphragm.

In some embodiments, the inner ventilation holes are close to the pillar.

In some embodiments, the outer ventilation holes are close to the edge of the diaphragm.

In some embodiments, the outer ventilation holes and the inner ventilation holes are arranged between the pillar and the edge of the diaphragm.

In some embodiments, the number of outer ventilation holes and the number of inner ventilation holes are different.

In some embodiments, the pillar is fixed on the backplate and the diaphragm.

In some embodiments, the pillar is connected to the backplate is separable from the diaphragm.

Some embodiments of the present disclosure include a MEMS structure.

The MEMS structure includes a substrate and a backplate, the substrate has an opening portion, and the backplate is disposed on one side of the substrate and has acoustic holes. The MEMS structure also includes a diaphragm disposed between the substrate and the backplate, and the diaphragm extends across the opening portion of the substrate and includes ventilation holes. The MEMS structure further includes a pillar disposed between the backplate and the diaphragm. The pillar prevents the diaphragm from being electrically connected to the backplate. Moreover, the MEMS structure includes a rib structure disposed on one side of the diaphragm.

In some embodiments, the rib structure is connected to the diaphragm.

In some embodiments, the rib structure is disposed on the side of the diaphragm opposite to the pillar and extends in the opening portion.

In some embodiments, the rib structure and the pillar are disposed on the same side of the diaphragm, and the rib structure extends towards the backplate.

In some embodiments, the rib structure comprises the same material as the diaphragm.

In some embodiments, the rib structure is disposed on the maximum deformation zone of the diaphragm.

In some embodiments, from a top view, the rib structure is disposed between the ventilation holes and the pillar.

In some embodiments, the ventilation holes are arranged in a concentric manner and divided into outer ventilation holes arranged near an edge of the diaphragm and inner ventilation holes arranged near the pillar.

In some embodiments, from a top view, the rib structure is disposed between the outer ventilation holes and the inner ventilation holes.

In some embodiments, from a top view, the rib structure is formed as a combination of multiple polygons.

In some embodiments, from a top view, the rib structure is formed as a combination of multiple spirals, a stadium shape, or multiple capsule shapes.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 1:
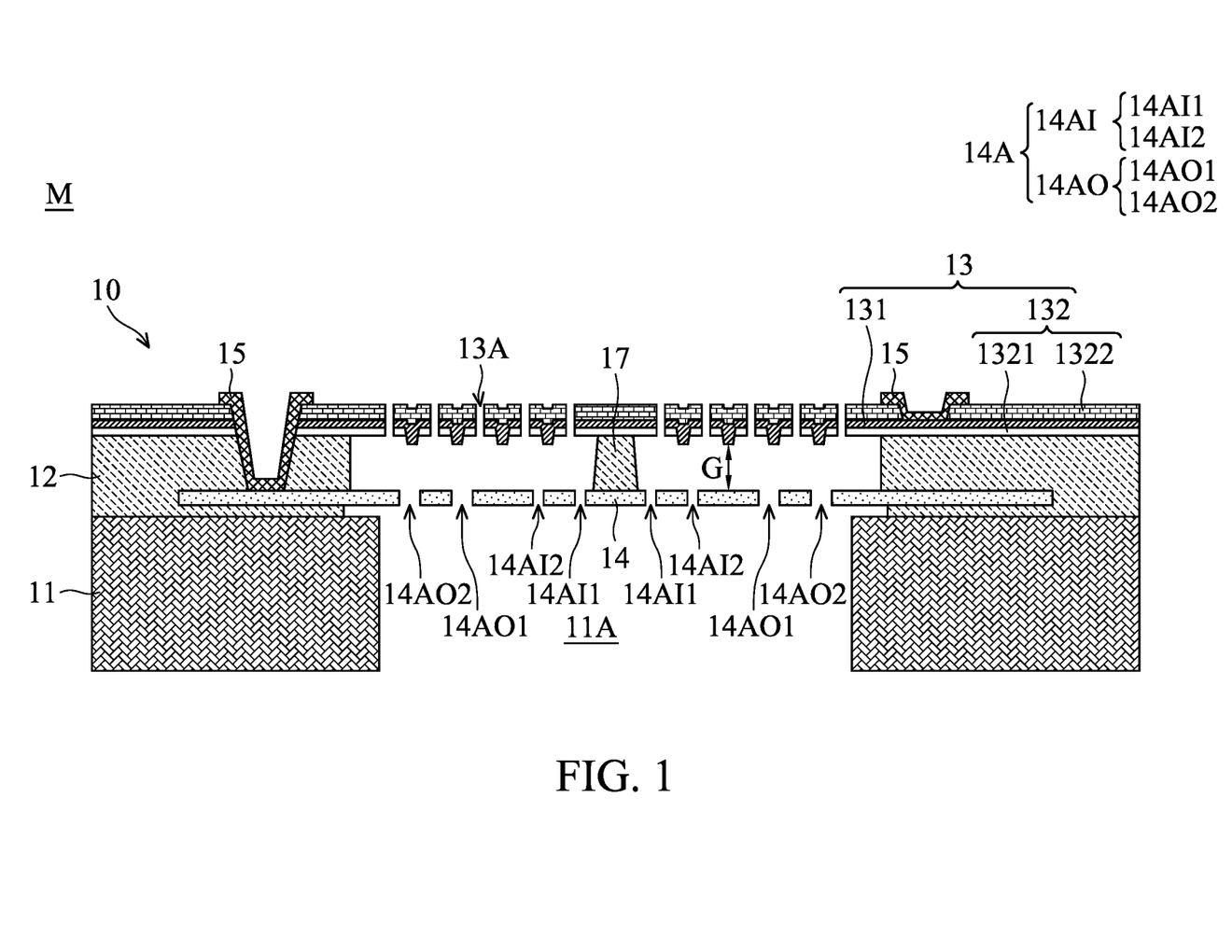
FIG. 1 is a partial cross-sectional view illustrating a micro-electro-mechanical system (MEMS) microphone according to some embodiments of the present disclosure.

FIG. 1 is a partial cross-sectional view illustrating a micro-electro-mechanical system (MEMS) microphone M according to some embodiments of the present disclosure. For example, the MEMS microphone M may be a capacitive microphone. As shown in FIG. 1, the MEMS microphone M includes a MEMS structure 10. In some embodiments, the MEMS structure 10 includes a substrate 11, a dielectric layer 12, a backplate 13, a diaphragm 14, and an electrode layer 15. It should be noted that some components of the MEMS microphone M (MEMS structure 10) have been omitted in FIG. 1 for sake of brevity.

The substrate 11 is configured to support the dielectric layer 12, the backplate 13, the diaphragm 14, and the electrode layer 15 on one side of the substrate 11. As shown in FIG. 1, in some embodiments, the substrate 11 has an opening portion 11A. The opening portion 11A allows sound waves received by the MEMS microphone M to pass through and/or enter the MEMS structure 10. For example, the substrate 11 may include silicon or the like, but the present disclosure is not limited thereto.

The dielectric layer 12 is disposed between the substrate 11 and the diaphragm 14, and between the diaphragm 14 and the backplate 13. In other words, the diaphragm 14 may be inserted in the dielectric layer 12, so as to provide partial isolation between the substrate 11, the diaphragm 14 and, the backplate 13 from each other. Moreover, the dielectric layer 12 is disposed around the backplate 13 and the diaphragm 14, such that the backplate 13 and the diaphragm 14 are supported at their edges by the dielectric layer 12. The dielectric layer 12 may be made of silicon oxide or the like. The backplate 13 is a stationary element disposed on one side of the substrate 11. The backplate 13 may have sufficient stiffness such that it would not be bending or movable when the sound waves pass through the backplate 13. For example, the backplate 13 may be a stiff perforated element, but the present disclosure is not limited thereto. As shown in FIG. 1, in some embodiments, the backplate 13 includes a number of acoustic holes 13A, and each acoustic hole 13A passes through the backplate 13. The acoustic holes 13A are configured to allow the sound waves to pass through.

As shown in FIG. 1, the backplate 13 may include a conductive layer 131 and an insulating layer 132 covering the conductive layer 131 for protection. The insulating layer 132 may further include a first insulating layer 1321 and a second insulating layer 1322. For example, the conductive layer 131 may include poly-silicon or the like, and the insulating layer 132 (e.g., the first insulating layer 1321 or the second insulating layer 1322) may include silicon nitride or the like, but the present disclosure is not limited thereto. Moreover, the first insulating layer 1321 and the second insulating layer 1322 may include the same material or different materials.

The MEMS structure 10 may be electrically connected to a circuit (not shown) via several electrode pads of the electrode layer 15 that is disposed on the backplate 13 and electrically connected to the conductive layer 131 and the diaphragm 14. For example, the electrode layer 15 may include copper, silver, gold, aluminum, the like, alloy thereof, or a combination thereof.

The diaphragm 14 is disposed between the substrate 11 and the backplate 13, and extends across the opening portion 11A of the substrate 11. The diaphragm 14 is movable or displaceable relative to the backplate 13. The diaphragm 14 is configured to sense the sound waves received by the MEMS microphone M. As shown in FIG. 1, in some embodiments, the diaphragm 14 includes ventilation holes 14A, and an air gap G is formed between the diaphragm 14 and the backplate 13. The sound waves pass through the diaphragm 14 via ventilation holes 14A to reach the air gap G, and then pass through the backplate 13 via acoustic holes 13A.

In more detail, the displacement change of the diaphragm 14 relative to the backplate 13 causes a capacitance change between the diaphragm 14 and the backplate 13. The capacitance change is then converted into an electric signal by circuitry connected with the diaphragm 14 and the backplate 13, and the electrical signal is sent out of the MEMS microphone M through the electrode layer 15.

On the other hand, in order to increase the sensitivity of the diaphragm 14, a number of ventilation holes 14A may be provided in the diaphragm 14 to reduce the stiffness of the diaphragm 14. In some embodiments, there may be more than two ventilation holes 14A. With this structural feature, high sensitivity of the MEMS microphone M can be achieved. In addition, the ventilation holes 14A in the diaphragm 14 are also configured to relieve the high air pressure on the diaphragm 14. In the embodiment shown in FIG. 1, the diaphragm 14 includes outer ventilation holes 14AO and inner ventilation holes 14AI. That is, the ventilation holes 14A are divided into the outer ventilation holes 14AO and the inner ventilation holes 14AI.

Figure 2:
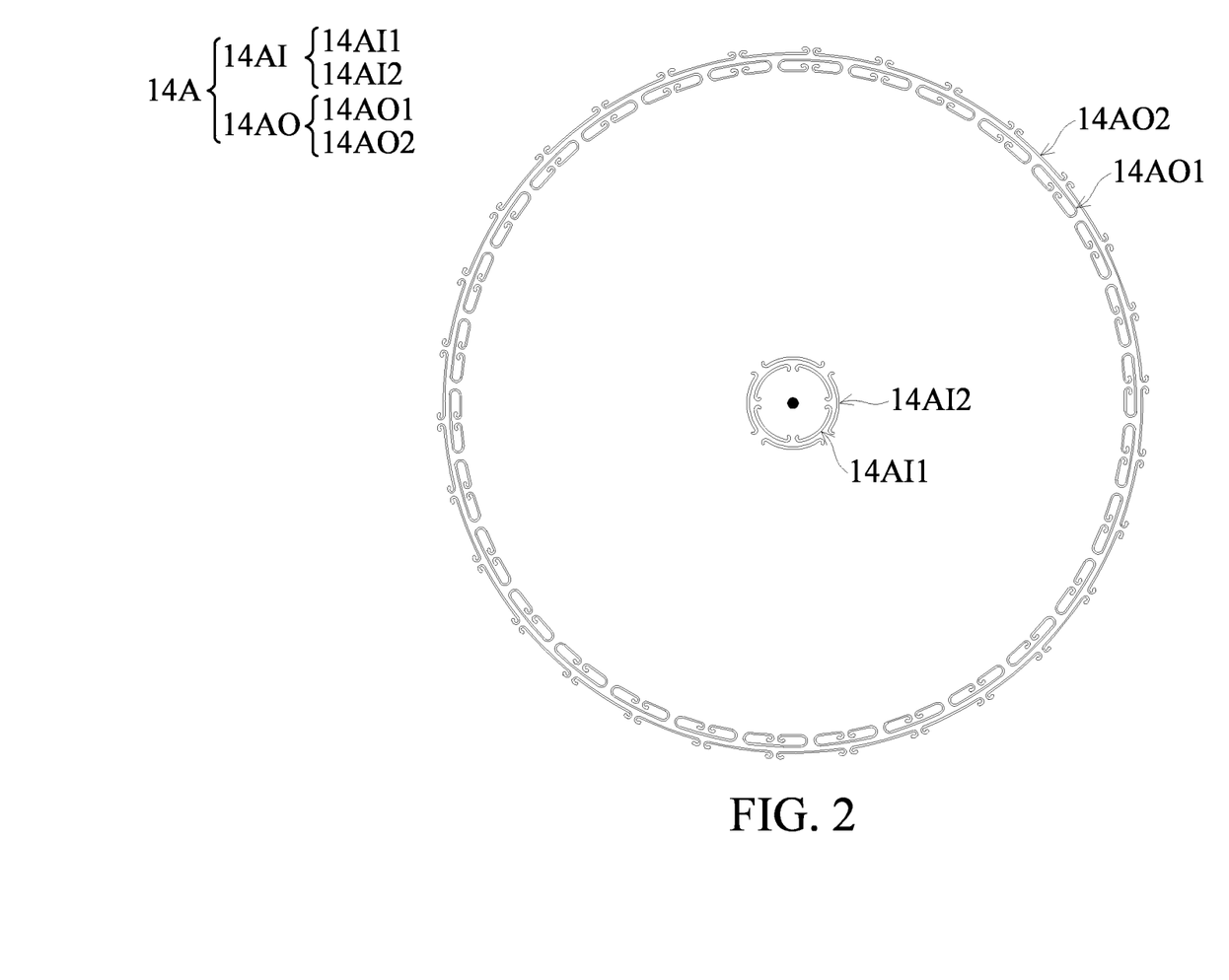
FIG. 2 is an example of a top view illustrating the ventilation holes.

FIG. 2 is an example of a top view illustrating the ventilation holes 14A. Referring to FIG. 2, in some embodiments, the outer ventilation holes 140 and the inner ventilation holes 141 are relatively arranged in a ring shape and surround the center of the diaphragm 14. In more detail, in some embodiments, the outer ventilation holes 140 are divided into first outer ventilation holes 14AO1 and second outer ventilation holes 14AO2, and the first outer ventilation holes 14AO1 and the second outer ventilation holes 14AO2 are staggered relative to the center of the diaphragm 14 as shown in FIG. 1 and FIG. 2. In this embodiment, the first outer ventilation holes 14AO1 are closer to the center of the diaphragm 14 than the second outer ventilation holes 14AO2.

Similarly, in some embodiments, the inner ventilation holes 141 are divided into first inner ventilation holes 14AI1 and second inner ventilation holes 14AI2, and the first inner ventilation holes 14AI1 and the second inner ventilation holes 14AI2 are staggered relative to the center of the diaphragm 14 as shown in FIG. 1 and FIG. 2. In this embodiment, the first inner ventilation holes 14AI1 are closer to the center of the diaphragm 14 than the second inner ventilation holes 14AI2.

As shown in FIG. 2, in some embodiments, each outer ventilation hole 14AO are C-shaped. Moreover, in some embodiments, openings of the C-shaped first outer ventilation holes 14AO1 face the center of the diaphragm 14, and openings of the C-shaped second outer ventilation holes 14AO2 face away from the center of the diaphragm 14.

Similarly, in some embodiments, each inner ventilation hole 14AI are C-shaped. Moreover, in some embodiments, openings of the C-shaped first inner ventilation hole 14AI1 face the center of the diaphragm 14, and openings of the C-shaped second inner ventilation hole 14AI2 face away from the center of the diaphragm 14.

In some embodiments, the number of outer ventilation holes 14AO (e.g., the first outer ventilation holes 14AO1 and the second outer ventilation holes 14AO2) and the number of inner ventilation holes 14AI (e.g., the first inner ventilation holes 14AI1 and the second inner ventilation holes 14AI2) are different. For example, the number of outer ventilation holes 14AO may be more than the number of inner ventilation holes 14AI as shown in FIG. 2, but the present disclosure is not limited thereto.

As shown in FIG. 1, the MEMS structure 10 further includes a pillar 17 disposed between the backplate 13 and the diaphragm 14, and the pillar 17 prevents the diaphragm 14 from being electrically connected to the backplate 13. In more detail, the pillar 17 may be in direct contact with the backplate 13 (e.g., the conductive layer 131) and the diaphragm 14. For example, the pillar 17 may include insulating material, such as silicon oxide or the like, but the present disclosure is not limited thereto.

In some embodiments, the pillar 17 is fixed on the backplate 13 and the diaphragm 14, but the present disclosure is not limited thereto. In some other embodiments, the pillar 17 is connected to the backplate 13 and is separable from the diaphragm 14. That is, the pillar 17 is not always in direct contact with the diaphragm 14 as shown in FIG. 1.

In some embodiments, the outer ventilation holes 140 (e.g., the first outer ventilation holes 14AO1 and the second outer ventilation holes 14AO2) are close to the edge of the diaphragm 14. In some embodiments, the inner ventilation holes 14AI (e.g., the first inner ventilation holes 14AI1 and the second inner ventilation holes 14AI2) are close to the pillar 17. In some embodiments, from a top view, the outer ventilation holes 14AO and the inner ventilation holes 14AI are arranged between the pillar 17 and the edge of the diaphragm 14.

Figure 3:
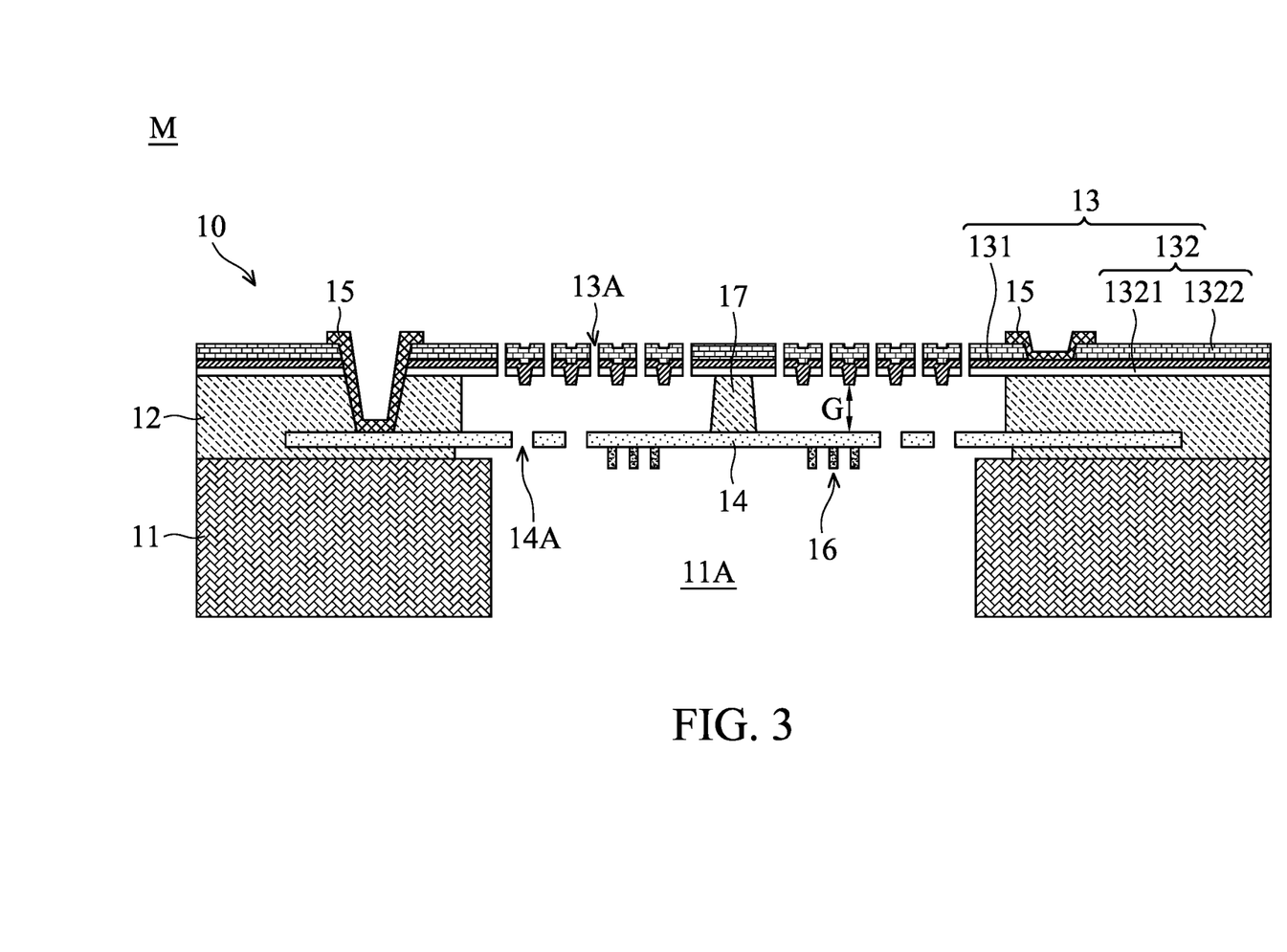
FIG. 3 is a partial cross-sectional view illustrating a micro-electro-mechanical system (MEMS) microphone according to some other embodiments of the present disclosure.

FIG. 3 is a partial cross-sectional view illustrating a micro-electro-mechanical system (MEMS) microphone M according to some other embodiments of the present disclosure. Similarly, some components of the MEMS microphone M (MEMS structure 10) have been omitted in FIG. 3 for sake of brevity.

Referring to FIG. 3, the MEMS structure 10 includes a substrate 11 and a backplate 13, the substrate 11 has an opening portion 11A, and the backplate 13 is disposed on one side of the substrate 11 and has acoustic holes 13A. The MEMS structure 10 also includes a diaphragm 14 disposed between the substrate 11 and the backplate 13, and the diaphragm 14 extends across the opening portion 11A of the substrate 11 and includes ventilation holes 14A. The MEMS structure 10 further includes a pillar 17 disposed between the backplate 13 and the diaphragm 14, and the pillar 17 prevents the diaphragm 14 from being electrically connected to the backplate 13.

In some embodiments, the MEMS structure 10 includes a rib structure 16 disposed on one side of the diaphragm 14. In more detail, in the embodiment shown in FIG. 3, the rib structure 16 is connected to (or in direct contact with) the diaphragm 14, and the rib structure 16 is disposed on the side of the diaphragm 14 opposite to the pillar 17 and extends in the opening portion 11A of the substrate 11, but the present disclosure is not limited thereto.

For example, the rib structure 16 may include a conductive material, such as polycrystalline silicon. Alternately, the rib structure 16 may include a dielectric material, such as silicon nitride, but the present disclosure is not limited thereto. In some embodiments, the rib structure 16 includes the same material as the diaphragm 14, but the present disclosure is not limited thereto. In some other embodiments, the rib structure 16 includes different materials from the diaphragm 14.

As shown in FIG. 3, in some embodiments, the rib structure 16 is disposed on the maximum deformation zone of the diaphragm 14. In some embodiments, from a top view, the rib structure 16 is disposed between the ventilation holes 14A and the pillar 17.

Figure 4:
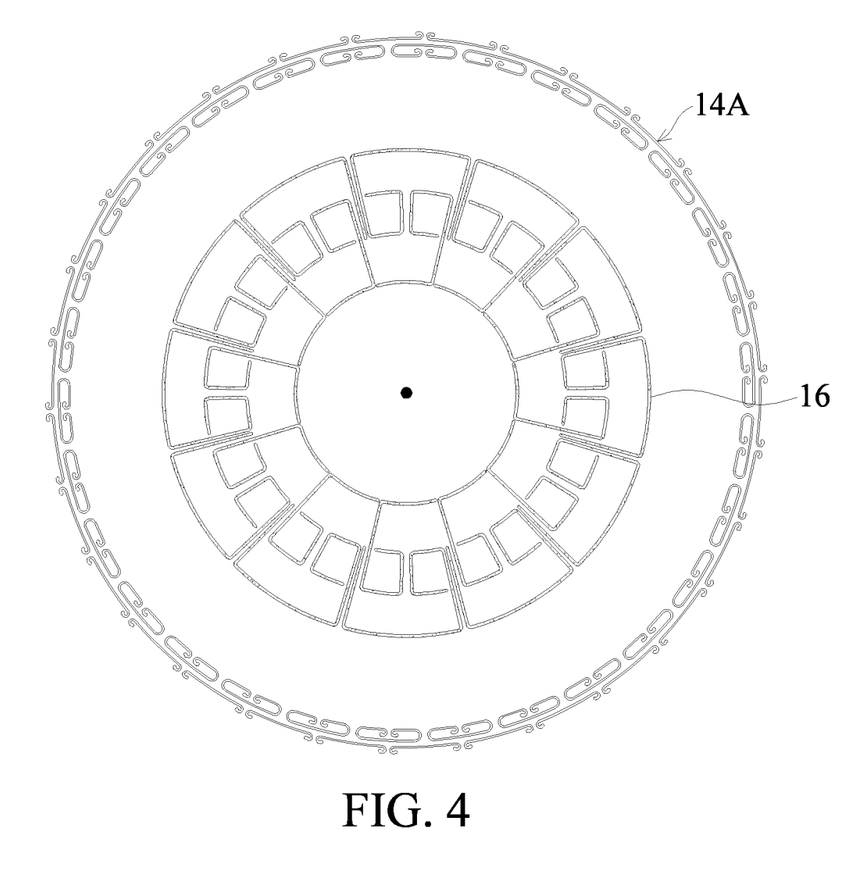
FIG. 4 is an example of a top view illustrating the ventilation holes and the rib structure.
Figure 5:
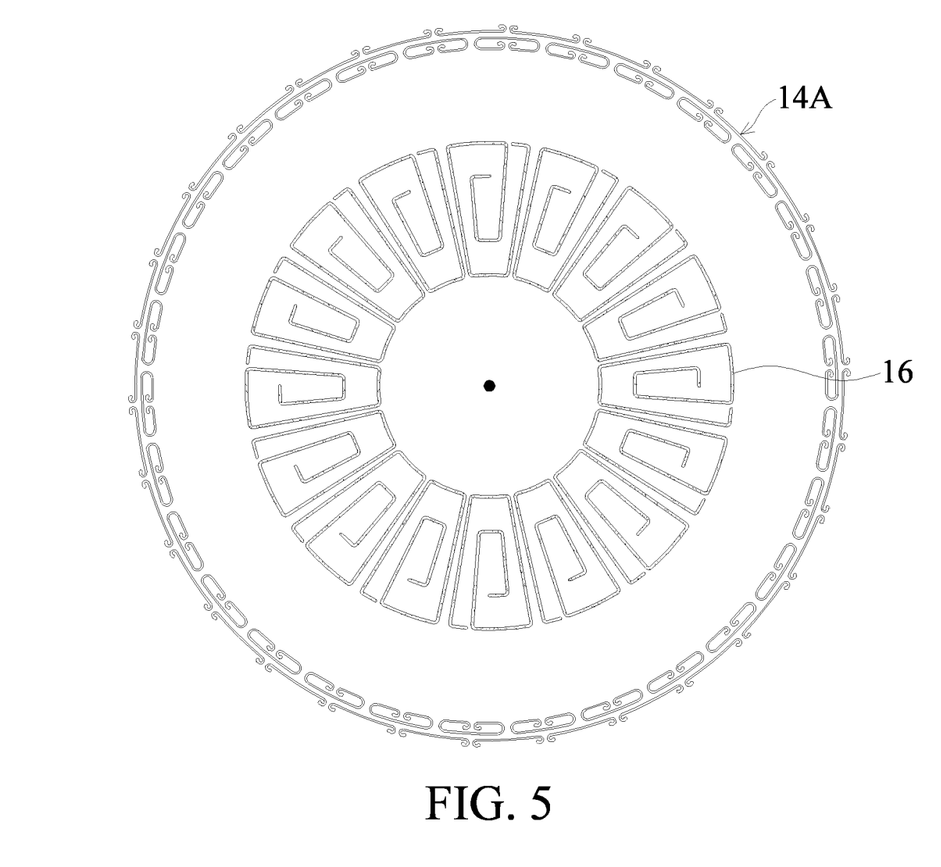
FIG. 5 is another example of a top view illustrating the ventilation holes and the rib structure.

FIG. 4 is an example of a top view illustrating the ventilation holes 14A and the rib structure 16. FIG. 5 is another example of a top view illustrating the ventilation holes 14A and the rib structure 16. The rib structure 16 is formed as a combination of multiple polygons as shown in FIG. 4, and the rib structure 16 is formed as a combination of multiple spirals as shown in FIG. 5, but the present disclosure is not limited thereto. The rib structure 16 may be formed as combination of other applicable shapes depending on the actual needs. Similarly, as shown in FIG. 4 and FIG. 5, the ventilation holes 14A are arranged in a concentric manner.

Figure 6:
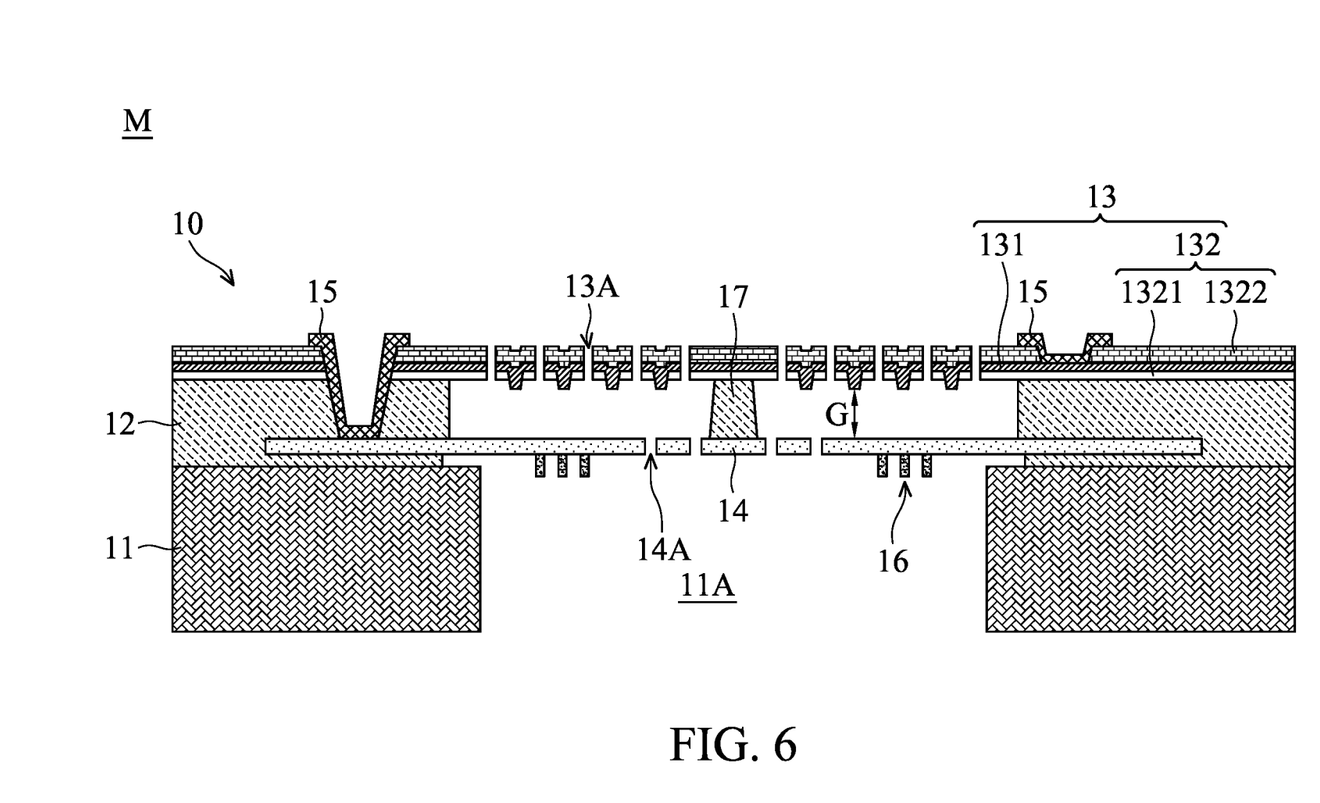
FIG. 6 is a partial cross-sectional view illustrating a micro-electro-mechanical system (MEMS) microphone according to some other embodiments of the present disclosure.

FIG. 6 is a partial cross-sectional view illustrating a micro-electro-mechanical system (MEMS) microphone M according to some other embodiments of the present disclosure. Similarly, some components of the MEMS microphone M (MEMS structure 10) have been omitted in FIG. 6 for sake of brevity.

Referring to FIG. 6, the rib structure 16 is disposed outside the ventilation holes 14A. In more detail, in some embodiments, from a top view, the rib structure 16 is disposed between the ventilation holes 14A and the edge of the diaphragm 14.

Figure 7:
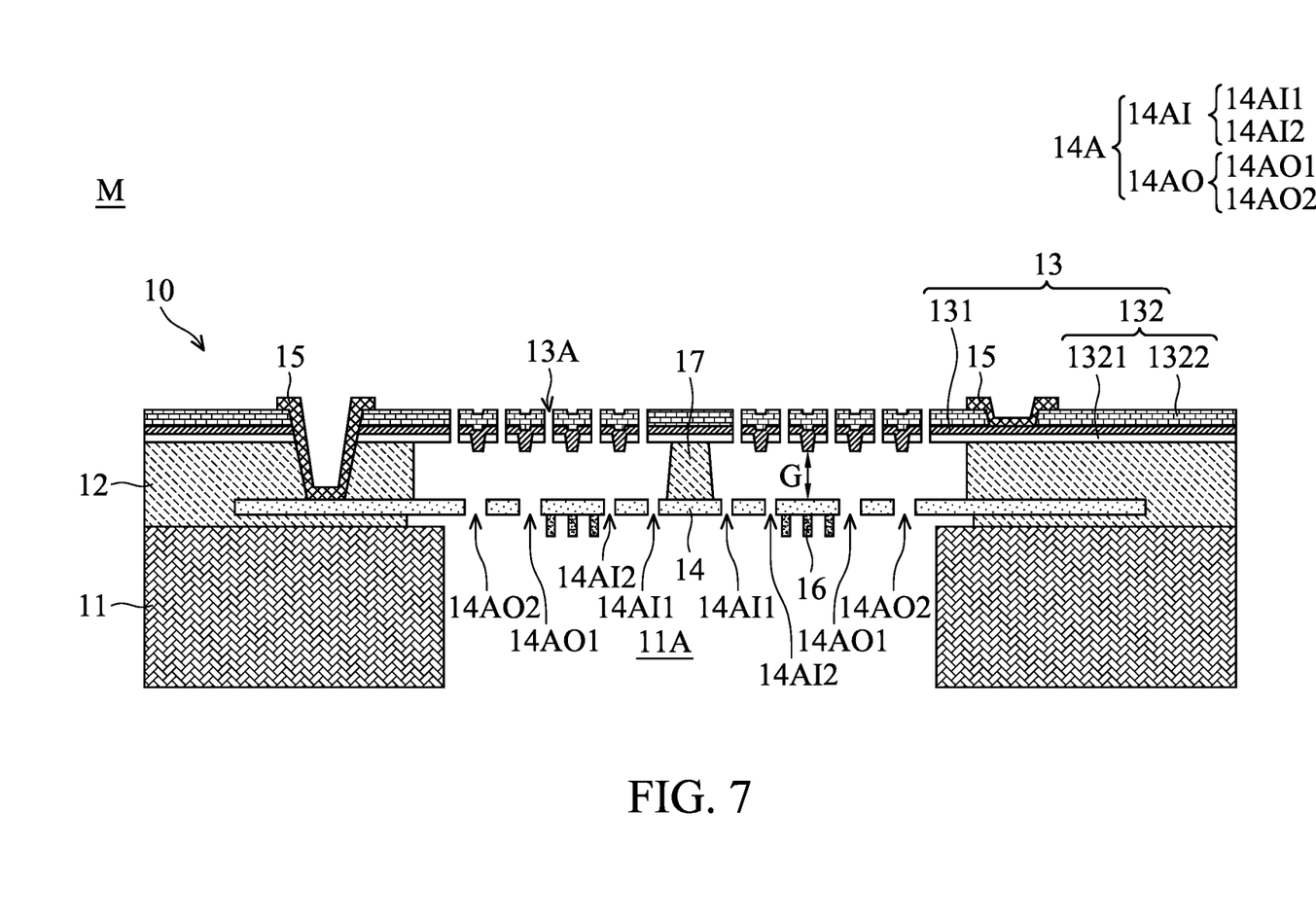
FIG. 7 is a partial cross-sectional view illustrating a micro-electro-mechanical system (MEMS) microphone according to some embodiments of the present disclosure.
Figure 8:
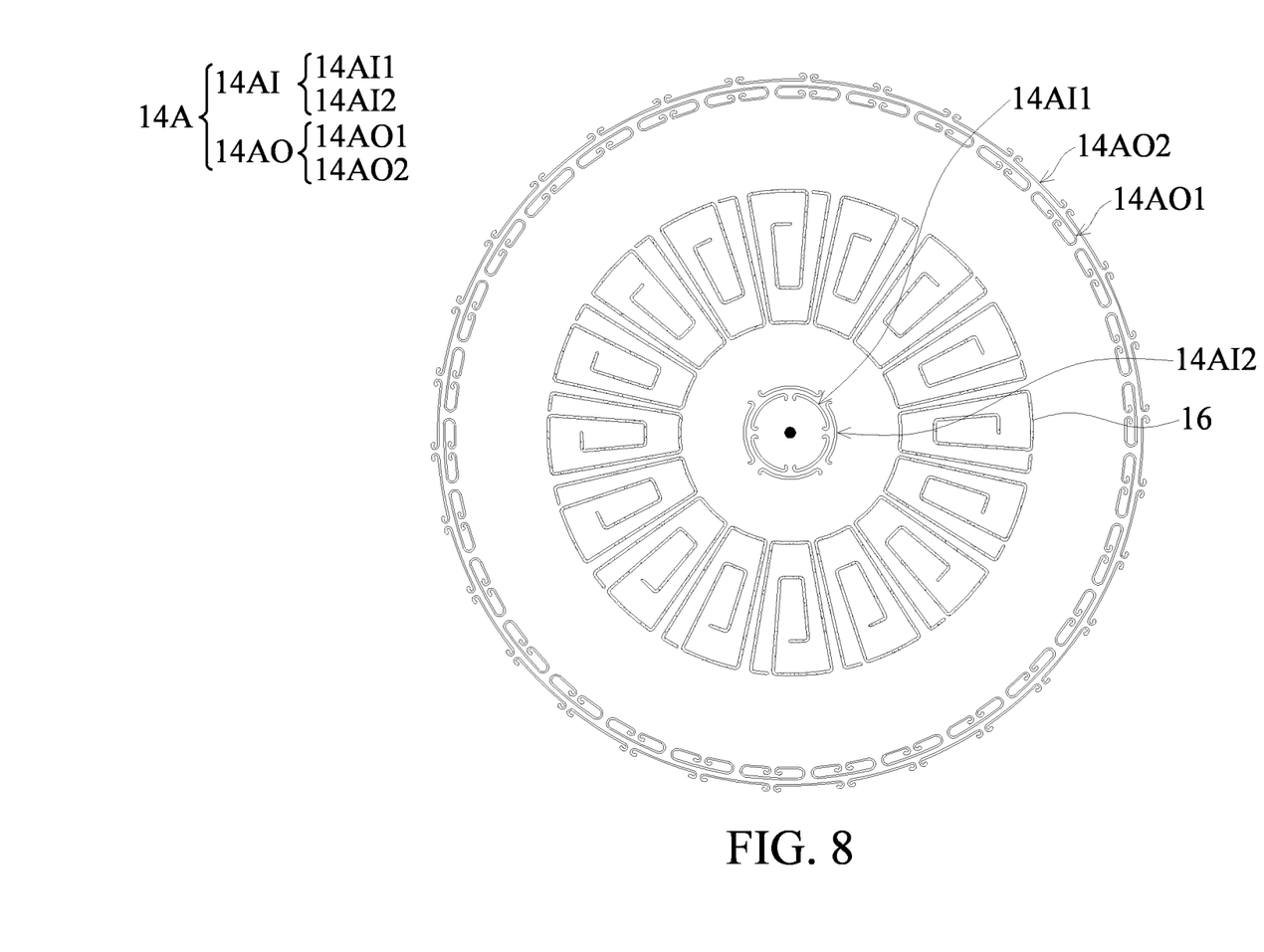
FIG. 8 is an example of a top view illustrating the ventilation holes and the rib structure.

FIG. 7 is a partial cross-sectional view illustrating a micro-electro-mechanical system (MEMS) microphone M according to some embodiments of the present disclosure. FIG. 8 is an example of a top view illustrating the ventilation holes 14A and the rib structure 16.

As shown in FIG. 7 and FIG. 8, in some embodiments, the ventilation holes 14A are divided into outer ventilation holes 14AO arranged near the edge of the diaphragm 14 and inner ventilation holes 14AI arranged near the pillar 17. In more detail, in some embodiments, the outer ventilation holes 140 are divided into first outer ventilation holes 14AO1 and second outer ventilation holes 14AO2, and the first outer ventilation holes 14AO1 and the second outer ventilation holes 14AO2 are staggered relative to the center of the diaphragm 14 as shown in FIG. 7 and FIG. 8. Similarly, in some embodiments, the inner ventilation holes 141 are divided into first inner ventilation holes 14AI1 and second inner ventilation holes 14AI2, and the first inner ventilation holes 14AI1 and the second inner ventilation holes 14AI2 are staggered relative to the center of the diaphragm 14 as shown in FIG. 7 and FIG. 8.

As shown in FIG. 7 and FIG. 8, in some embodiments, from a top view, the rib structure 16 is disposed between the outer ventilation holes 14AO (e.g., the first outer ventilation holes 14AO1 and the second outer ventilation holes 14AO2) and the inner ventilation holes 14AI (e.g., the first inner ventilation holes 14AI1 and the second inner ventilation holes 14AI2). Moreover, in the embodiment shown in FIG. 8, the rib structure 16 is formed as a combination of multiple spirals, but the present disclosure is not limited thereto.

Figure 9:
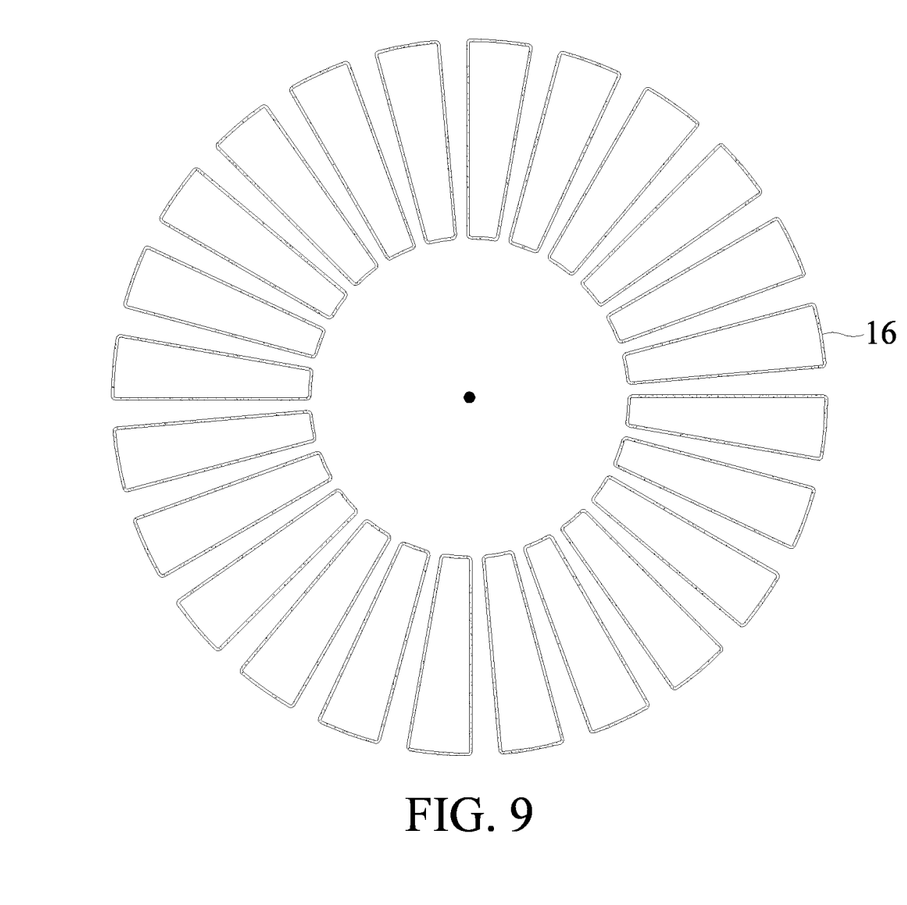
FIG. 9 is an example of a top view illustrating the rib structure.
Figure 10:
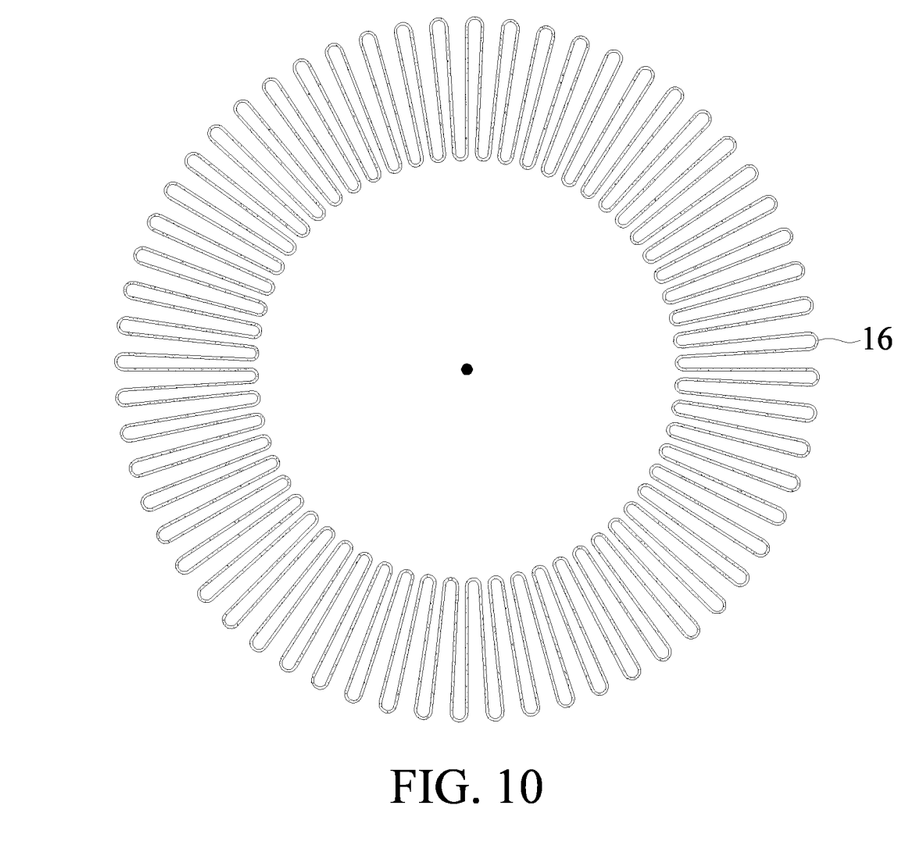
FIG. 10 is another example of a top view illustrating the rib structure.

FIG. 9 is an example of a top view illustrating the rib structure 16. FIG. 10 is another example of a top view illustrating the rib structure 16. From a top view, the rib structure 16 is formed as a combination of multiple trapezoid-like patterns as shown in FIG. 9, and the rib structure 16 is formed as a stadium shape or multiple capsule shapes as shown in FIG. 10. The rib structure 16 may be formed as other geometries, including circular, rectangular, triangular, etc.

In the foregoing embodiments, the MEMS structure includes inner ventilation holes of the diaphragm or a rib structure disposed on one side of the diaphragm. Due to the inner ventilation holes of the diaphragm or the rib structure, which may increase the acoustic resistance, part of the diaphragm can be strengthened, so that a relatively flat deformation plateau zone of the diaphragm may be formed after the diaphragm is deformed by the sound pressure. Therefore, the distribution of the induced charge is more uniform and the capacitance between the backplate and the diaphragm is improved, thereby improving the total harmonic distortion (THD), signal-to-noise ratio (SNR), and acoustic overload point (AOP) of the MEMS microphones.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro-electro-mechanical system structure, comprising:
   a substrate having an opening portion;
   a backplate disposed on one side of the substrate and having acoustic holes;
   a diaphragm disposed between the substrate and the backplate, extending across the opening portion of the substrate, and comprising outer ventilation holes and inner ventilation holes arranged in a concentric manner, wherein the outer ventilation holes and the inner ventilation holes are relatively arranged in a ring shape and surround a center of the diaphragm; and
   a pillar disposed between the backplate and the diaphragm, wherein the pillar includes insulating material to prevent the diaphragm from being electrically connected to the backplate, and the inner ventilation holes are adjacent to the pillar.

2. The micro-electro-mechanical system structure as claimed in claim 1, wherein the outer ventilation holes are divided into first outer ventilation holes and second outer ventilation holes, and the first outer ventilation holes and the second outer ventilation holes are staggered relative to the center of the diaphragm.

3. The micro-electro-mechanical system structure as claimed in claim 1, wherein the inner ventilation holes are divided into first inner ventilation holes and second inner ventilation holes, and the first inner ventilation holes and the second inner ventilation holes are staggered relative to the center of the diaphragm.

4. The micro-electro-mechanical system structure as claimed in claim 1, wherein the outer ventilation holes are disposed outside the inner ventilation holes and away from the pillar.

5. The micro-electro-mechanical system structure as claimed in claim 1, wherein the outer ventilation holes and the inner ventilation holes are arranged between the pillar and an edge of the diaphragm.

6. The micro-electro-mechanical system structure as claimed in claim 1, wherein the number of outer ventilation holes and the number of inner ventilation holes are different.

7. The micro-electro-mechanical system structure as claimed in claim 1, wherein the pillar is fixed on the backplate and the diaphragm.

8. The micro-electro-mechanical system structure as claimed in claim 1, wherein the pillar is connected to the backplate and is separable from the diaphragm.

9. A micro-electro-mechanical system structure, comprising:
   a substrate having an opening portion;
   a backplate disposed on one side of the substrate and having acoustic holes;
   a diaphragm disposed between the substrate and the backplate, extending across the opening portion of the substrate, and comprising ventilation holes;
   a pillar disposed between the backplate and the diaphragm, wherein the pillar includes insulating material to prevent the diaphragm from being electrically connected to the backplate; and
   a rib structure disposed on one side of the diaphragm, wherein the rib structure is made from a different material property than the diaphragm.

10. The micro-electro-mechanical system structure as claimed in claim 9, wherein the rib structure is connected to the diaphragm.

11. The micro-electro-mechanical system structure as claimed in claim 9, wherein the rib structure is disposed on the side of the diaphragm opposite to the pillar and extends in the opening portion.

12. The micro-electro-mechanical system structure as claimed in claim 9, wherein the rib structure and the pillar are disposed on the same side of the diaphragm, and the rib structure extends towards the backplate.

13. The micro-electro-mechanical system structure as claimed in claim 9, wherein the rib structure is disposed on a maximum deformation zone of the diaphragm.

14. The micro-electro-mechanical system structure as claimed in claim 9, wherein from a top view, the rib structure is disposed between the ventilation holes and the pillar.

15. The micro-electro-mechanical system structure as claimed in claim 9, wherein the ventilation holes are arranged in a concentric manner and divided into outer ventilation holes and inner ventilation holes, the inner ventilation holes are adjacent to the pillar, and the outer ventilation holes are disposed outside the inner ventilation holes.

16. The micro-electro-mechanical system structure as claimed in claim 15, wherein from a top view, the rib structure is disposed between the outer ventilation holes and the inner ventilation holes.

17. The micro-electro-mechanical system structure as claimed in claim 9, wherein from a top view, the rib structure is formed as a combination of multiple polygons.

18. The micro-electro-mechanical system structure as claimed in claim 9, wherein from a top view, the rib structure is formed as a combination of multiple spirals, a stadium shape, or multiple capsule shapes.

* * * * *